(12) United States Patent
Mueller et al.

(10) Patent No.: US 9,740,096 B2
(45) Date of Patent: Aug. 22, 2017

(54) POSITIVE-TONE, CHEMICALLY AMPLIFIED, AQUEOUS-DEVELOPABLE, PERMANENT DIELECTRIC

(71) Applicant: Georgia Tech Research Corporation, Atlanta, GA (US)

(72) Inventors: Brennen Karl Mueller, Atlanta, GA (US); Paul A. Kohl, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 150 days.

(21) Appl. No.: 14/411,767

(22) PCT Filed: Jun. 28, 2013

(86) PCT No.: PCT/US2013/048553
§ 371 (c)(1),
(2) Date: Dec. 29, 2014

(87) PCT Pub. No.: WO2014/005011
PCT Pub. Date: Jan. 3, 2014

(65) Prior Publication Data
US 2015/0160551 A1    Jun. 11, 2015

Related U.S. Application Data

(60) Provisional application No. 61/787,175, filed on Mar. 15, 2013, provisional application No. 61/666,104, filed on Jun. 29, 2012.

(51) Int. Cl.
*B32B 3/10* (2006.01)
*G03F 7/004* (2006.01)
(Continued)

(52) U.S. Cl.
CPC .............. *G03F 7/0045* (2013.01); *C08K 5/42* (2013.01); *C08K 5/55* (2013.01); *G03F 7/0392* (2013.01);
(Continued)

(58) Field of Classification Search
CPC .............................................. Y10T 428/24802
See application file for complete search history.

(56) References Cited

U.S. PATENT DOCUMENTS 6,028,153 A * 2/2000 Jung ..................... C08F 222/40
522/904
2002/0128408 A1 9/2002 Goodall et al.
(Continued)

OTHER PUBLICATIONS

Mueller (Positive-Tone, Aqueous-Developable, Polynorbornene Dielectric:Lithographic, and Dissolution Properties) Jun. 7, 2012.*
(Continued)

*Primary Examiner* — Christopher Polley
(74) *Attorney, Agent, or Firm* — Myers Bigel, P.A.

(57) ABSTRACT

In microelectronic applications, it is often desired to deposit and pattern a permanent dielectric film in order to electrically and mechanically isolate components. Photo-patternable dielectrics are attractive for these uses because of their reduced time and cost requirements. These permanent dielectrics should be high-speed, positive-tone, and aqueous-developable. This type of patternability may be achieved by using a chemically amplified deprotection reaction of tert-butoxycarbonate or tert-butyl acrylate catalyzed by a photo-inducible acid. Provided herein are: a composition for preparing a dielectric film comprising a polymer mixture, wherein the polymer mixture comprises a base polymer comprising a pendent protected organic functionality, a photocatalyst for deprotecting the protected organic functionality and a chemical cross-linker for cross-linking the dielectric film after a photo-patterning has taken place in
(Continued)

an aqueous solution; a dielectric film prepared from said composition; and method of preparing a dielectric film.

41 Claims, 5 Drawing Sheets

(51) Int. Cl.
| | | |
|---|---|---|
| *C08K 5/55* | (2006.01) | |
| *C08K 5/42* | (2006.01) | |
| *G03F 7/039* | (2006.01) | |
| *G03F 7/075* | (2006.01) | |
| *G03F 7/40* | (2006.01) | |
| *G03F 7/26* | (2006.01) | |

(52) U.S. Cl.
CPC .......... *G03F 7/0395* (2013.01); *G03F 7/0757* (2013.01); *G03F 7/26* (2013.01); *G03F 7/40* (2013.01); *Y10T 428/24802* (2015.01)

(56) References Cited

U.S. PATENT DOCUMENTS

| | | | | |
|---|---|---|---|---|
| 2004/0229157 A1* | 11/2004 | Rhodes | .................... | C08F 2/38 430/270.1 |
| 2004/0242798 A1* | 12/2004 | Sounik | .................... | C08F 6/02 525/333.3 |
| 2009/0120905 A1 | 5/2009 | Kohl et al. | | |

OTHER PUBLICATIONS

Notification of Transmittal of the International Search Report and the Written Opinion of the International Searching Authority, or the Declaration corresponding to International Application No. PCT/US2013/048553 mailed Dec. 13, 2013.

International Preliminary Report on Patentability corresponding to International Application No. PCT/US2013/048553 mailed Jan. 8, 2015.

* cited by examiner

POSITIVE-TONE, CHEMICALLY AMPLIFIED, AQUEOUS-DEVELOPABLE, PERMANENT DIELECTRIC

RELATED APPLICATIONS

The present application is a 35 U.S.C. §371 national phase application of PCT International Application No. PCT/US2013/048553, having international filing date of Jun. 28, 2013, which claims the benefit under 35 U.S.C. §119(e) of U.S. Provisional Application Ser. No. 61/666,104, filed Jun. 29, 2012, and U.S. Provisional Application Ser. No. 61/787,175, filed Mar. 15, 2013, the entire contents of each of which are incorporated by reference herein. The above-referenced PCT International Application was published as International Publication No. WO 2014/005011 A2 on Jan. 3, 2014.

BACKGROUND OF THE INVENTION

Dielectrics serve essential functions in devices, including microelectronic devices. Dielectric materials and films are electrical insulators which provide mechanical or structural support for electronic, mechanical, or electromechanical devices. Dielectric films are used to electrically and mechanically isolate electrical or microelectromechanical components from other device components or the outside environment. In this respect, the films must be of high mechanical quality and have a low or tunable dielectric constant. In addition, the ability to directly photo-pattern the dielectric film without the use of a temporary photoresist for pattern transfer is attractive due to the decreased time and cost requirements for device manufacturing. Negative-tone dielectrics often have good lithographic properties, but typically require organic solvents to develop the latent image. In addition, negative-tone materials often use a bright field mask where most of the mask is transparent. This leads to higher defect rates than dark field masks because particles on the mask have a high probability of resulting in component defects. Existing positive-tone dielectrics, however, have lithographic limitations. These limitations include poor patternability and low photo-speed because each chemical reaction requires at least one photon. Thus, thick dielectric films require very high optical doses.

Presently, the cost of lithographic tools significantly impacts on the cost of the final component. Furthermore, the nature of the developers used to develop the latent image also impacts the effect of the lithographic process on health, safety and environmental issues in the manufacture of such components. Organic solvents used to develop negative-tone, photosensitive dielectrics are often flammable, and are potentially hazardous to the health of the employees and to the environment. The use of aqueous developers is thus desirable because they are less hazardous to workers and the environment.

Polymers can generally provide the needed electrical, mechanical, and chemical properties with the added benefit of easy and low-cost processing. Some polymer dielectrics are photo-definable, which reduces the number and severity of the steps required to etch vias through the dielectric films. Positive-tone materials are more suitable for interlayer dielectric applications than negative-tone materials since positive-tone materials use mostly opaque masks, making photolithography less sensitive to particulates and increasing yield. Additionally, the ability to develop the latent image in an aqueous solution (e.g. aqueous base) reduces the need for environmentally harmful organic solvents.

A desirable combination of attributes for thick film, permanent dielectrics is to have positive-tone imaging, aqueous development, and high optical sensitivity and contrast. However, common diazoquinone (DQ)-containing, positive-tone materials have low sensitivity and photospeed due to the low quantum efficiency of DQ (Mack (1988) *Applied Optics* 27, 4913-4919). DQ also has a high absorption coefficient making exposure of thick films difficult. Fortunately, the absorption coefficient of the DQ photoproduct, indene carboxylic acid (ICA), is less than DQ, providing a photo-bleaching effect. However, thick films still require doses on the order of 100 to 1000 mJ/cm$^2$ (Maier (2001) *Progress in Polymer Science* 26, 3-65; Vleggaar et al. (1994) *Journal of the American Chemical Society* 116, 11754-11763; Mueller et al. (2012) *Journal of Applied Polymer Science* doi:10.1002/app.38055).

Chemically amplified (CA) mechanisms are a route to improving the photospeed compared to DQ-based systems. The most popular positive-tone CA systems are made possible by an acid catalyzed deprotection of a pendent functional group to cause a developer solubility switch, making the exposed regions soluble in aqueous base developer (Reichmanis et al. (1991) *Chemistry of Materials* 3, 394-407; Ito (2000) *IBM Journal of Research and Development* 44, 119-130). A functional group, such as an acid or alcohol, is called protected when it is in a different chemical form which can be readily converted into the deprotected form, acid or alcohol in this example. For example, tert-butoxycarbonyl (TBOC) and tert-butyl ester (TBE) are the protected forms of an alcohol and a carboxylic acid, respectively. When the TBOC or TBE is converted into an alcohol or carboxylic acid, respectively, it is called the action of "deprotection". The addition and exposure of a small amount of a photoacid generator (PAG) can result in multiple deprotection reactions. The most common CA systems involve the deprotection of a TBOC or a TBE moiety to produce an alcohol or a carboxylic acid, respectively. The resulting deprotected groups are soluble in aqueous base developer whereas the unexposed regions remain insoluble. The high optical sensitivity of these mixtures enables thick film, positive-tone polymer films with good lithographic properties.

In order to obtain good mechanical and electrical properties in a permanent dielectric, it is often necessary to cross-link the polymer film. Cross-linking is the formation of a chemical bond, often a covalent bond between two previously unbounded moieties within the polymer mixture so that the average molecular weight of the polymer increases. Cross-linking usually improves the chemical or mechanical properties of the polymer, and can decrease its solubility in a solvent or developer. However, problems can arise with cross-linking in CA chemistries because many cross-linking mechanisms are acid catalyzed. For example, epoxy cross-linkers readily ring open in the presence of an acid and react with alcohols and carboxylic acids to form base-insoluble ethers and esters at low temperature, respectively (Raeis-zadeh, et al. (2011) *Journal of Applied Polymer Science* 120, 1916-1925; Parker & Isaacs (1959) *Chemical Reviews* 59, 737-799). Exposure and baking of a positive-tone CA film with multifunctional epoxy additives would cause the deprotection and immediate cross-linking of the exposed regions, leaving the exposed regions insoluble in the base developer.

Thus, there remains a need for chemical functionalities and a mechanism to enable preparation of positive-tone, aqueous-developable, CA, cross-linkable dielectrics.

SUMMARY OF THE INVENTION

To address this need, provided in an aspect of the invention is a composition for preparing a photo-patternable, high-sensitivity, positive-tone, permanent dielectric. Provided in another aspect of the invention is a photo-patternable, high-sensitivity, positive-tone, permanent dielectric. The high-sensitivity, photodefinability has been achieved in yet another aspect of the invention by a method of preparing a permanent dielectric by the use of a positive-tone, chemical amplification mechanism. In the chemical amplification mechanism, a photon absorbed by the photo-sensitive film generates a catalyst. The catalyst initiates a chemical reaction resulting in the formation of a latent image. The reaction product is soluble in an aqueous solution, such as aqueous base. In addition to forming a soluble product, the catalyst species is regenerated. Thus, each photon results in many chemical reactions in the chemically amplified system, rather than a single chemical reaction in a traditional photosensitive system.

The film of the invention may be used as a passivation layer of components in microelectronic devices. The high mechanical strength of the film of the invention may protect components in microelectronic devices from environmental damage. The low dielectric constant of the composition and film of the invention may facilitate electrically isolating components in microelectronic devices. This may result in lower electrical loss, permitting closer packed components and smaller devices.

The film of the invention may also be used as a thick film separator for a wide variety of mechanical, electrical, or electromechanical devices, including chip-stacking applications. Such may serve to thermally and electrically isolate devices while allowing for electrical connections to be made between the devices. Fabricating high-aspect ratio vias in a thick film may permit the use of through-silicon vias.

Further advantages provided by the composition and film of the invention may result in a much faster photo-speed than positive-tone dielectrics that presently exist. Less energy may be required for photo-patterning, and therefore higher throughput is possible. The present invention also permits the exclusion of epoxy-based cross-linkers, which may allow for compositions and films with lower dielectric constants. Additionally, the dielectric constant of the materials of the present invention may further be tuned by varying the polymer composition. Moreover, in that the materials of the present invention are positive-tone, fabrication may be facilitated of dielectric layers with holes to make electrical connections.

Thus, in one aspect, the present invention provides a composition for preparing a dielectric film comprising a polymer mixture, wherein the polymer mixture comprises:

a base polymer comprising a pendent protected organic functionality;

a photocatalyst for deprotecting the protected organic functionality; and a chemical cross-linker for cross-linking the dielectric film after photo-patterning has taken place in an aqueous solution.

In another aspect, the present invention provides a dielectric film comprising a polymer mixture, wherein the polymer mixture comprises:

a base polymer comprising a pendent protected organic functionality;

a photocatalyst for activating the protected organic functionality; and a chemical cross-linker for cross-linking the dielectric film after photo-patterning has taken place in an aqueous solution.

In yet another aspect, the present invention also provides a method of preparing a dielectric film comprising the steps of:

providing a base polymer comprising a pendent protected organic functionality and a photocatalyst for deprotecting the pendent protected organic functionality;

patterning the base polymer with a mask;

deprotecting the pendent protected organic functionality;

developing a positive-tone image in an aqueous base to provide a photo-pattern on the dielectric film; and curing the dielectric film with a chemical cross-linker.

In still another aspect, the present invention also provides a dielectric film prepared by a method of preparing a dielectric film comprising the steps of:

providing a base polymer comprising a pendent protected organic functionality and a photocatalyst for deprotecting the pendent protected organic functionality;

patterning the base polymer with a mask;

deprotecting the pendent protected organic functionality;

developing a positive-tone image in an aqueous base to provide a photo-pattern on the dielectric film; and curing the dielectric film with a chemical cross-linker.

These and other aspects of the invention are addressed in more detail in the drawings and description of the invention set forth below.

DETAILED DESCRIPTION OF PREFERRED EMBODIMENTS

The composition for preparing a photo-patternable, high-sensitivity, positive-tone, permanent dielectrics as set forth herein may comprise a base polymer, pendent protected organic functionalities, activators and cross-linking agents.

A variety of base polymers (photo-inactive polymer) may be used that are known within the art. Non-limiting examples of base polymers of the invention include polymethacrylate, polyacrylates, polystyrenes, polyimides, polyamides, polysiloxane, polysilsesquioxanes, and polynorbornenes. In a particular embodiment of the invention, the base polymer may be poly(tert-butyl methacrylate). In another embodiment, the base polymer may be poly(2-hydroxyethyl methacrylate). The base polymer may be synthesized from and contain one or more different and distinctive monomers. In some embodiments, the distinctive monomers are selected from the group consisting of acrylic, methacrylic and norbornene-type monomers. Accordingly, in an embodiment, the base polymer may be a copolymer of tert-butyl methacrylate and 2-hydroxyethyl methacrylate. In still another embodiment, the base polymer may be polynorbornene. The base polymer may have a pendent protected organic functionality comprising functional groups as a copolymer. Examples of monomers of such pendent protected organic functionalities include, but are not limited to TBOC or TBE. In another embodiment, the norbornene of the base polymer may be norbornene tert butyl ester (I). In a further embodiment, the norbornene of the base polymer may be norbornene hexafluoro-2-methyl-2-propanol (II). In still another embodiment, the base polymer may be a copolymer of (I) and (II).

Other protected organic functionalities may be used in different embodiments of the invention. In other embodiments of the invention, an aliphatic molecule with a radically-initiated or base-catalyzed cross-linking functionality may be used as part of the copolymer to provide better mechanical and dielectric properties. Mechanical and dielectric properties of the film of the invention may also be altered by varying the amount of monomer in the copolymer composition. The copolymer composition may also be used to reduce the volume change often observed in CA resists after the post-exposure bake and improve the dissolution properties of the film. Exemplary copolymer functional groups are shown in Table 1.

TABLE 1

| Possible Monomer Functionalities | | |
|---|---|---|
| | Monomer 1 | Monomer 2 |
| Polymer 1 | TBE | Alcohol |
| Polymer 2 | Carboxylic Acid | TBOC |
| Polymer 3 | TBE | TBOC |

Polymer 1 has a pendent alcohol functionality (HEMA) to the base polymer and a pendent carboxylic acid functionality. The carboxylic acid can be produced via the thermal deprotection of TBE on TBMA. This system was chosen because the volume change during deprotection is likely to be small. The deprotection of the TBE produces isobutylene whereas the deprotection of the TBOC produces both isobutylene and carbon dioxide. Polymer 2 is attractive if a lower temperature or shorter deprotection time is needed since the TBOC deprotection occurs more readily than that of the TBE (Waliraff et al. (1995) *Proceedings of SPIE* 2438, 182-190). However, having pendent carboxylic acid moieties on the base polymer may increase the uptake of aqueous base in unexposed regions, similar to other positive-tone systems that contain a pendent carboxylic acid (Mueller et al. (2012) *Journal of Applied Polymer Science* doi:10.1002/app.38055). This may lead to a higher degree of swelling and may distort the spatial resolution of the patterned film. Polymer 3 may have less uptake of aqueous base in the unexposed regions due to the lack of an acidic proton. Polymer 3 may also have the best contrast of the three polymers in Table 1 due to the largest change in solubility between the unexposed and exposed states. Additionally, a 1:1 ratio of the two monomers would decrease the number of unreacted monomers in the film after cross-linking. This can improve the material properties and the dielectric constant. However, since each monomer has to undergo a deprotection reaction, the volume change for Polymer 3 may be the largest.

Other embodiments of the invention may include a terpolymer of any of the three polymers listed in Table 1 with an additional unreactive monomer to improve the dielectric constant. A saturated hydrocarbon pendent group can serve this purpose. With this terpolymer, there would be more room to adjust the monomer ratios to achieve full cross-linking of the alcohol and carboxylic acid moieties while maintaining control of solubility and patternability. In yet another embodiment, small molecule cross-linkers can be added to the formulation. Depending on the base polymer, these can be multifunctional alcohols or multifunctional carboxylic acids. In some embodiments, the multifunctional alcohol or multifunctional carboxylic acid is alkoxylated. In other embodiments, the multifunctional alcohol or multifunctional carboxylic acid is acrylated. Small molecule cross-linkers allow for partial cross-linking of the unexposed films and lessen the volume change due to the deprotection reaction. For example, if the Polymer 2 formulation contained a small amount of glycol additives, a low temperature cure could be done to cross-link some of the carboxylic acid groups with the glycol additives. Subsequent deprotection of the TBOC moieties by exposure and baking would produce more alcohol groups, and a final cure would be done to complete the cross-linking reaction. In an embodiment, cross-linking of the polymer backbone/dielectric material is enabled by the inclusion of trimethylolpropane ethoxylate.

In still further embodiments of the invention, other suitable polymer backbones are available for use as a permanent dielectric. Further non-limiting examples of polymer backbones that are suitable as a thermally stable polymer backbone with good mechanical and electrical properties include: polystyrene; polyimide; polyamide; and/or polysilsesquioxane. A wide range of polymers used in fabrication of mechanical, microelectromechanical, and fluidic devices can be photoprinted. Superior photoprinting (e.g. photospeed through chemical amplification), and environmentally sound developing (e.g. aqueous developing) is preferred. In still further embodiments, polymers containing a wide variety of building blocks, such as: polyethylene; polypropylene; bisphenol-A; polyethylene oxide; polyethylene terephthalate; polyphenols; and/or polysiloxanes, can be functionalized or mixed with the chemical moieties described herein and patterned in a chemically amplified way and cross-linked as set forth herein.

Exemplary but non-limiting pendent protected organic functionalities as set forth herein may lack an acidic proton and are thus insoluble in aqueous base. In an embodiment of the invention, the polymer mixture also contains a photo-acid generator (PAG) as the activator or catalyst. A variety of PAGs may be used that are known with the art. Non-limiting examples of PAGs include tetrakis-(pentafluorophenyl)borate-4-methylphenyl[4-(1-methylethyl)phenyl]iodonium (Rhodorsil-FABA), tris(4-tert-butylphenyl) sulfonium tetrakis-(pentafluorophenyl) borate (TTBPS-FABA), triphenylsulfonium tetrakis-(pentafluorophenyl) borate (TPS-FABA), bis(4-tert-butylphenyl)iodonium triflate (BTBPI-TF), tert-(butoxycarbonylmethoxynaphthyl)-diphenylsulfonium triflate (TBOMDS-TF), N-hydroxynaphthalimide triflate (NHN-TF), diphenyliodonium perfluoro-1-butanesulfonate (DPI-NF), tris(4-tert-butylphenyl)sulfonium perfluoro-1-butanesulfonate (TTBPS-NF), N-hydroxynaphthalimide perfluoro-1-butanesulfonate (NHN-NF), N-hydroxy-5-norbornene-2,3-dicarboximide perfluoro-1-butanesulfonate (NHNDC-NF), bis(4-tert-butylphenyl)iodonium tris(perfluoromethanesulfonyl) methide, (BTBPI-TMM), bis(4-tert-butylphenyl)iodonium bis(perfluorobutanesulfonyl) imide (BTBPI-BBI), diphenyliodonium 9,10-dimethoxyanthracene-2-sulfonate (DPI-DMOS), bis(4-tert-butylphenyl) iodonium p-toluenesulfonate (BTBPI-PTS), a non-ionic PAG such as Ciba IRGACURE® PAG 263 (III) and bis(4-tert-butylphenyl) iodonium perfluoro-1-octanesulfonate (BTBPI-HDF).

yields a base-soluble carboxylic acid and isobutylene (Scheme 2). In further embodiments of the invention, the catalyst may be a photo-base generator, wherein deprotection results in aqueous acid-soluble reaction products, wherein development may include acidic solutions.

Scheme 1: Deprotection reaction of TBOC funtional group

Scheme 2: Deprotection reaction of TBE funtional group

In the embodiments set forth in Schemes 1 and 2, isobutylene and carbon dioxide are gaseous products which leave (III)

In a particular embodiment, the PAG is Rhodorsil-FABA. In another embodiment of the invention, the PAG produces a strong acid upon irradiation with ultraviolet radiation. In yet another embodiment, the base polymer can be synthesized such that the conjugate base of the activated PAG is pendent on the base polymer. Having the conjugate base pendent on the base polymer prevents diffusion of the conjugate base to other regions of the polymer film, such as the non-irradiated region. If the conjugate base diffuses to the non-irradiated regions of the polymer, it could facilitate transport of the photo-generated acid to those regions through electro-static interactions between the anion (i.e. conjugate base) and cation (i.e. photoacid). In a particular embodiment of the invention, the ultraviolet radiation used is 248 nm in wavelength. The acid produced catalyzes a deprotection reaction of the pendent organic functionality, and development of a photo-pattern includes aqueous basic solutions. In an embodiment of the invention, deprotection of TBOC yields a base-soluble alcohol along with carbon dioxide and isobutylene reaction products (Scheme 1). In another embodiment of the invention, deprotection of TBE the film. This solubility change mechanism is chemically-amplified, as each acid molecule used to deprotect the TBOC or TBE functional groups is regenerated and thus serves the role of a catalyst. Chemical amplification provides an advantage because only a very small amount of PAG is necessary and thus does not alter the properties of the dielectric. Furthermore, the energy required for patterning is smaller than non-amplified systems (high photo-speed) in that smaller amounts of photoactive compound i.e., a catalytic amount, are needed for activation. Benefits provided include higher device throughput with the same processing tools, and ultimately providing lower fabrication costs. Low concentration of PAG loading results in a lower dielectric constant of the film because the properties of the base polymer may be optimized. Photoactive compounds typically contain conjugated moieties to absorb light which increases the available electron pathways and mobile charge carriers that raise the dielectric constant. Alternatively, aqueous acid-soluble forms of the deprotected base polymer may be used.

The base polymer according to the invention has appropriate electrical and chemical properties to be used as a permanent dielectric. The polymer film may then be cross-linked in a post-development or curing step. The film is cured after photo-patterning in order to give the film high mechanical strength and a low dielectric constant. Numerous cross-linking mechanisms may be used that are known within the art to create a stable, permanent dielectric after patterning which do not interfere with the chemically amplified patterning process in the preparation of permanent films of the invention. In an embodiment of the invention, it is desirable to have the films be initially insoluble in aqueous base in the unexposed form, followed by a reaction leading to a solubility switch when exposed to UV radiation. Prior to curing, in another embodiment, it is desirable to have both carboxylic acid and alcohol functionalities present, at least one on the base polymer. Non-limiting examples of cross-linking mechanisms that may be used including thermal cross-linking free radical initiated cross-linking, acid catalyzed cross-linking, base catalyzed cross-linking or a reaction, such as condensation, that involves a different thermally-induced reactive species, for example, via a Wolff rearrangement of an α-diazo ketone to form a reactive ketene. In a particular embodiment of the invention, cross-linking may take place by heating the polymer mixture in the presence of diazonaphthoquinone (DQ) results in a solvent-insoluble, or cross-linked, film. Insolubility of the cured film in organic solvents is indicative that cross-linking occurred.

In another embodiment, cross-linking of the base polymer/dielectric material may take place by free radical initiation. For example, alkenyl-substituted polymers, including the base polymer, may be added to the mixture. A free radical photo-initiator may be used to react with unsaturated alkenyl bonds pendent on the base polymer, or added as a mixture, resulting in cross-linking. A non-limiting example of a free-radical photo-initiator is bis~2,4,6-trimethylbenzoyl-phenylphosphineoxide (Irgacure 819, Ciba Specialty Chemicals Inc.). Other examples of photo-active and thermally-active free radical initiators include, for example, azobisisobutyronitrile and benzoyl peroxide. The addition of unsaturated, for example alkenyl, pendent groups on the base polymer allows for cross-linking via a free radical polymerization mechanism. The conditions of the curing are subject to the radical initiator activation. For example, cross-linking can be initiated at a specific temperature after patterning by selection of a thermally generated free radical initiator. In further embodiments, cross-linking of functional groups may occur by acid catalysis, base catalysis, or a reaction, such as condensation, that involves a different thermally-induced reactive species such as a ketene, such as via a Wolff rearrangement of an α-diazo ketone. In still further embodiments, the radical- or base-generating cross-linking compound is photo-active at a wavelength other than that of the initial, chemically amplified reaction. In particular embodiments, this wavelength is 365, 405, or 436 nm. This provides the possibility that the polymer film is both positive- and negative-tone, which adds processing advantages for particular fabrication sequences. In still further embodiments, the cross-linking moiety comprises an epoxy group.

In other embodiments of the invention, the cross-linking mechanism is compatible with the traditional CA solubility switching mechanism and the cross-linking mechanism does not interfere with the acid-activated deprotection and subsequent development of polymers with pendent TBOC, TBE, or other protected functionalities. The cross-linking is enabled by the inclusion of an alcohol and a carboxylic acid as organic pendent groups on a polymer backbone. These functionalities can be on the original polymer or can be produced via the acid catalyzed deprotection. After the exposed portions of the film are removed by an aqueous base solution, the film can be cross-linked via the Fischer esterification of an alcohol and carboxylic acid, as shown in Scheme 3. This cross-linking mechanism does not interfere with the photo-patterning, because the esterification reaction is slow compared to the deprotection of the polymer at normal processing temperatures. The final cure should involve the continuous removal of water from the film since it is a product of the esterification. This can be done under an inert atmosphere at low temperatures or under normal atmospheric conditions at higher temperature (>100° C.).

Scheme 3: Cross-linking by acid catalyzed Fischer esterification

In other embodiments, patternability and subsequent cross-linking take place on a random copolymer of tert-butyl methacrylate (TBMA) and 2-hydroxyethyl methacrylate (HEMA), shown following acid catalyzed deprotection in Scheme 4. In further embodiments, patternability and subsequent cross-linking take place on a random copolymer of norbornene t-butyl ester and norbornene hexafluoro-2-methyl-2-propanol. Unexposed films are insoluble in aqueous base. Incorporation of a PAG into the formulation and exposure to 248 nm radiation causes the aqueous base solubility switch. Films are effectively patterned at exposure doses characteristic of CA systems and then cross-linked during an extended cure at an elevated temperature.

Scheme 4: Acid catalyzed deprotection of poly (TMBA-co-HEMA)

In still further embodiments, the cross-linking mechanism is selected so that it is not catalyzed during creation of the latent image. As provided herein for a positive-tone, CA, aqueous-developable dielectric, a slower acid catalyzed cross-linking reaction can be used than the acid catalyzed deprotection reaction. If a fast cross-linking reaction were acid catalyzed, then the latent image would be insoluble in aqueous base. Photogenerated free radical initiators are also available. If these types of initiators were chosen so that they absorb at wavelengths different from the PAG exposure wavelength, a photo-induced cross-linking of the film can be performed. This two-photon process, using two different wavelengths of radiation, can allow for positive-tone patterning of the film at one wavelength followed by negative-tone cross-linking at a different wavelength.

In still further embodiments, cyclic ether rings have internal bond strain, which makes them easily activated and reactive once ring-opening has occurred, can be used for cross-linking. Cyclic ethers of varying number of carbon atoms and configurations, for example, epoxides, can be used for post-development curing of the photopatterned polymer. The degree of bond strain in the cyclic ether can be selected and the activation method can be chosen from known routes, such as thermal activation, chemical activation or photoactivation (at a wavelength different from that of patterning). The rate of cross-linking can be chosen so that it does not interfere with the chemically amplified photopatterning step.

In summary, it has been demonstrated that: (i) the patternability of a positive-tone, chemically-amplified dielectric that contains an additional cross-linking compound; (ii) the ability to cure this material with a thermal bake; and (iii) the possibility of cross-linking this type of material by a variety of mechanisms. The net result is a material with improved lithographic properties, and excellent mechanical and electrical properties.

Particular embodiments of the invention will now be described with reference to the following non-limiting examples.

Example 1

Chemically Amplified Patterning on a Random Copolymer of Norbornene t-Butyl Ester and Norbornene Hexafluoro-2-Methyl-2-Propanol An oxide coated silicon wafer was treated with a 3-(trimethoxysilyl) propyl methacrylate solution (5 weight percent in acetone) for adhesion promotion. The wafer was baked at 100° C. for 120 s followed by rinsing with acetone to remove excess adhesion promoter. A film containing 3 parts Rhodorsil FABA photoacid generator (PAG) per hundred parts polynorbornene by mass was made by spin-coating onto the wafer. The wafer was soft baked at a temperature of 100° C. for 120 seconds. At this point, the film was insoluble in 0.26 N tetramethylammonium hydroxide (TMAH) developer.

The film, approximately 3 µm thick, was then exposed to 248 nm ultraviolet radiation using a variable density optical mask. The wafer was post-exposure baked at 110° C. for 30 s. The film was developed for 30 seconds in a 0.065 N TMAH developer solution. An unexposed film is insoluble in the developer whereas a fully exposed film, when the t-butyl ester has been converted to a carboxylic acid, is soluble in the aqueous base developer. The contrast and sensitivity, $D_{100}$, were obtained from plotting the normalized film thickness versus logarithmic exposure dose and linearly fitting the curve near the $D_{100}$. The contrast was 11.5, and the sensitivity was 155.7 mJ/cm². At the $D_{100}$ exposure dose of 155.7 mJ/cm² of 248 nm radiation, the maximum incident dose corresponds to $1.94 \times 10^{17}$ photons/cm² or $3.23 \times 10^{-7}$ moles of photon per square centimeter. The UV dose was corrected for reflection from the air/quartz interface and the quartz/polymer interface. The air/quartz interface has a reflection coefficient of 0.053, and the quartz/polymer interface has a reflection coefficient of 0.001, assuming a polymer index of refraction of 1.5. Using an absorption coefficient for the PAG at 248 nm radiation of 0.452 µm⁻¹, 73% of the radiation was absorbed by the polymer film. The incident intensity was $1.94 \times 10^{17}$ photons/cm². Correcting the incident intensity for reflections reduced the photon dose to $1.84 \times 10^{17}$ photons/cm². Based on the absorption coefficient (73% absorbed, on-average), there were $1.34 \times 10^{17}$ photons/cm² absorbed in the film. There were $4.96 \times 10^{15}$ PAG/cm². This gives an average of 27 photons/PAG at $D_{100}$. Assuming the polynorbornene copolymer had 75 mole percent t-butyl ester norbornene polymer, and a film density of 1 g/cm³, there were $5.6 \times 10^{17}$ protected acid moieties/cm². If every PAG was activated by the 27-fold excess of photons, this would result in 113 t-butyl ester groups per PAG. If all the PAG was not activated (which is possible), the number of t-butyl ester groups/PAG would be more than 113. This shows that each PAG likely activated many t-butyl ester groups, and the factor of 113 t-butyl ester groups/PAG is consistent with chemical amplification.

Chemical amplification was confirmed by investigating the weight loss during activation of the t-butyl ester, which results in the loss of the butylene group. Thermogravimetric analysis (TGA) was performed on two samples of the polynorbornene backbone polymer film to determine the mass of the photochemical reaction products. The two films were processed as above up to the exposure step. One of the samples was exposed and the other was not exposed. The TGA ramp rate was 5° C./min to reach the post exposure bake temperature, 110° C., which was maintained for 30 minutes. The unexposed sample was treated as a baseline for solvent loss and was subtracted from the mass loss of the exposed sample. The exposed sample showed a loss of 14.7 wt %, after accounting for solvent and moisture loss. Any weight loss from the exposed sample is assumed to be due to the butylene leaving group from the t-butyl ester starting material. If one photon caused one chemical reaction resulting in loss of one butylene group, the resulting weight loss would be 3 wt %. Thus, the 14.7 wt % loss corresponds to 5 chemical reactions per photon, confirming chemical amplification.

The patterned sample was exposed to 1000 mJ/cm² at 248 nm to activate the PAG. The sample was then cured at 256° C. for two hours. The sample was immersed in the TMAH developer solution and it was found not to dissolve. This indicates that the sample cross-linked during the cure via the Fischer esterification mechanism. An uncross-linked sample would be soluble in the developer. Samples cured at a lower temperature, where cross-linking did not take place, were soluble in TMAH.

Example 2

Film Prepared from TMBA, Rhodorsil-FABA and Cross-Linked with DQ

Figure 1:
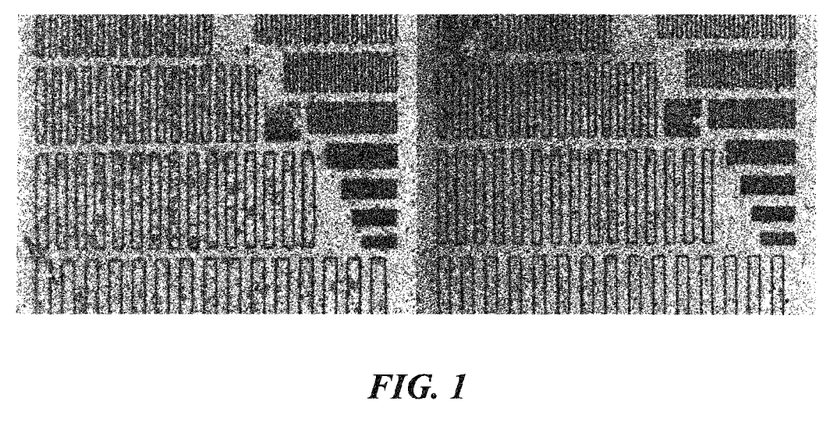
FIG. 1 shows the images of hills (left) and trenches (right) of the patterned material made from poly(tert-butyl methacrylate) as the base polymer, Rhodorsil-FABA as the PAG, and a thermally-induced cross-linking compound, diazoquinone (DQ) as the cross-linking compound.

The mixtures were patterned with standard photoresist techniques. In this particular example, a mixture of poly (tert-butyl methacrylate) as the base polymer, Rhodorsil-FABA as the PAG, and a thermally-induced cross-linking compound, diazoquinone (DQ), were dissolved in propylene glycol monomethyl ether acetate solvent. The particular DQ used was 2,4-dihydroxybenzophenone esterified at ~100% with 2,1,5-diazonapthoquinone sulfonic acid. The film mixture was cast from the organic solvent by spin-coating followed by soft-baking on a hotplate. The soft bake at 100° C. removed excess solvent after spin coating. Exposure to 248 nm light through a photomask resulted in acid generation by the PAG in the exposed regions creating the latent image. A post-exposure bake was necessary to complete the polymer deprotection and for acid diffusion. Subsequent development in aqueous base, 0.26 N tetramethylammonium hydroxide, dissolved the deprotected regions of the film, creating the positive-tone image of the photomask on the wafer. FIG. 1 shows the images of hills and trenches of the patterned material made from poly(tert-butyl methacrylate) as the base polymer, Rhodorsil-FABA as the PAG, and a thermally-induced cross-linking compound, diazoquinone (DQ) as the cross-linking compound.

Example 3

Film Prepared from TMBA:HEMA, Rhodorsil-FABA and Cross-Linked by Esterification

Characterization Equipment.

$^1$H-NMR spectra were recorded on a Varian Mercury Vx 400 MHz instrument. Spectra were recorded in CDCl$_3$ and the protonated solvent peak at 7.26 ppm was used as an internal standard. Molecular weight measurements were made by gel permeation chromatography (GPC), using a Waters 2690 separation module and a 2410 differential refractive index detector. These were connected to Waters Styragel columns (HP 1, HP 3, and HP 4), and THF was used as an eluent and solvent. Molecular weights were compared to polystyrene standards. Glass transition temperatures ($T_g$) were measured by differential scanning calorimetry (DSC) with a TA Instruments DSC Q20 equipped with a Q-series DSC pressure cell. Measurements were taken under an unpressurized, nitrogen atmosphere. DSC samples were heated to 160° C. at a rate of 10° C./min and then cooled to 60° C. to remove the thermal history. Samples were again heated to 160° C. at a rate of 10° C./min for $T_g$ measurements. Thermogravimetric analysis (TGA) was done with a TA Instruments TGA Q50. TGA samples were heated at 5° C./min to a final temperature of 500° C. Scanning electron microscopy (SEM) was performed on a Zeiss Ultra 60 SEM. Samples for SEM were coated with 18 to 20 nm of palladium using a Hummer 6 Sputterer to prevent charging during analysis.

Synthesis of Poly(TBMA-co-HEMA).

TBMA and HEMA monomers were purchased from TCI America and Alfa Aesar, respectively, and were filtered through alumina before use to remove inhibitors. Azobisisobutyronitrile (AIBN) was purchased from Sigma Aldrich. A 100 mL round bottom flask was loaded with THF (25.5 mL), TBMA (5 g, 35.2 mmol), HEMA (2.29 g, 17.6 mmol), AIBN (31.9 mg, 0.194 mmol), and a stir bar. The flask was purged with dry nitrogen gas for 30 min, and the clear solution was stirred at 60° C. for 23 hours. The polymer was precipitated in H$_2$O (700 mL) from THF and collected on filter paper. The polymer was then precipitated in hexanes (750 mL) from THF, collected on filter paper, and dried in vacuo at 50° C. to yield a white powder in good yield (6.13 g, 83.8%).

Preparation of Thin Films.

Formulations were made containing 20 to 35 wt % poly(TBMA-co-HEMA) in propylene glycol monomethyl ether acetate (PGMEA) and various loadings of Rhodorsil FABA PAG (provided by Promerus, LLC). Films were cast by spin coating on a CEE 100CB spinner at a speed of 1500 to 2500 rpm onto untreated <100> silicon wafers. Thin films (<5 μm) were baked after spin coating at 100° C. for 1 min to remove residual solvent. Thicker films were baked after spin coating at 100° C. for 2 min.

Lithographic Property Measurements.

UV exposures were performed with an Oriel Instruments flood exposure source with a 1000 W Hg(Xe) broadband lamp filtered to 248 nm. A post exposure bake was performed at various temperatures and times to catalyze the deprotection reaction in exposed regions. The films were then developed in MF-319, a 0.26 N tetramethylammonium hydroxide (TMAH) developer. Contrast and sensitivity were measured by exposing 9 to 10 μm thick films through a variable density optical mask (Opto-line International Inc.). Thickness measurements were made with a VeecoDektak 3 profilometer, and the thickness was plotted against the logarithmic exposure dose. The contrast (γ) is defined as the slope of this curve, which was fitted in a linear least squares method nearest to $D_{100}$ (minimum dose at which 100% of film develops) (Plummer et al. (2000) *Silicon VLSI Technology*, Prentice Hall, Upper Saddle River, N.J.). Films were cured in a tube furnace under a N$_2$ atmosphere at 120° C. for 10 hours.

Stress Measurements.

Wafer curvature was measured with a Flexus Tencor Thin Film Stress Measurement System, Model F2320, equipped with a He—Ne laser. Deflection measurements were recorded over the middle 80 mm of a 100 mm Si wafer with 670 nm and 750 nm laser irradiation. The wavelength with the highest reflected intensity was used to prevent errors due to destructive interference. The thin film stress (σ) was calculated using Stoney's equation, $$\sigma = (E/(1-v))(h^2/6Rt)$$

Where E/(1−v) is the biaxial elastic modulus of the substrate, h is the substrate thickness, R is the effective radius of curvature of the substrate, and t is the film thickness. R is calculated by $$1/R = 1/R_1 - 1/R_2$$

Where $R_1$ is the radius of curvature of the bare substrate and $R_2$ is the new radius of curvature after film deposition.

Poly(TBMA-co-HEMA).

Figure 2:
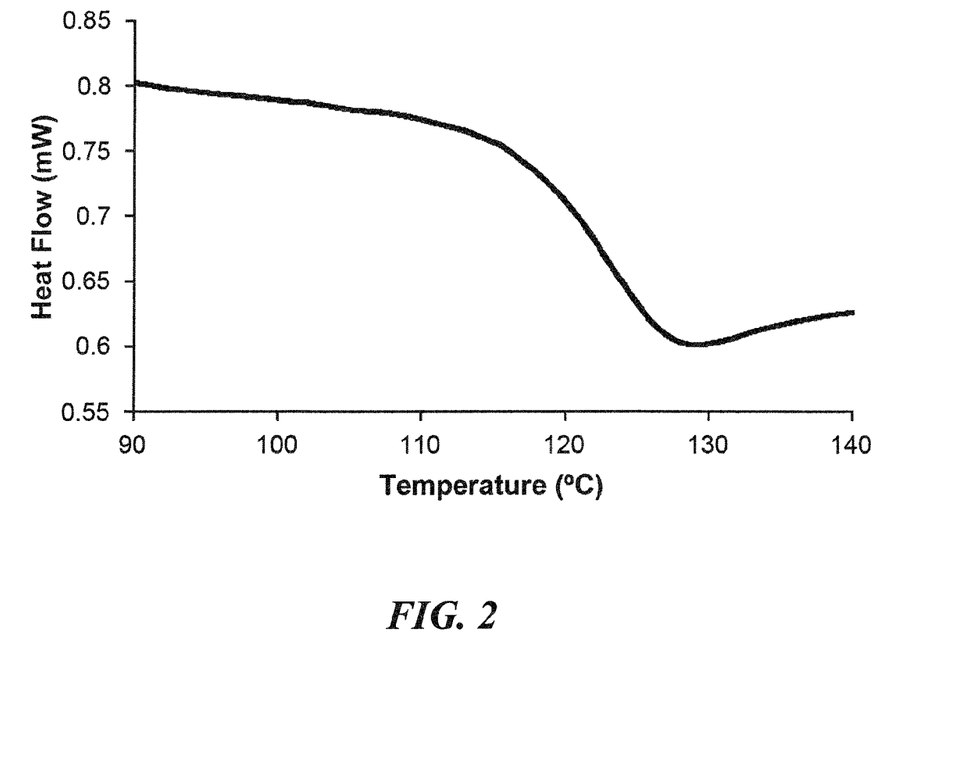
FIG. 2 shows DSC analysis of poly(TMBA-co-HEMA).
Figure 3:
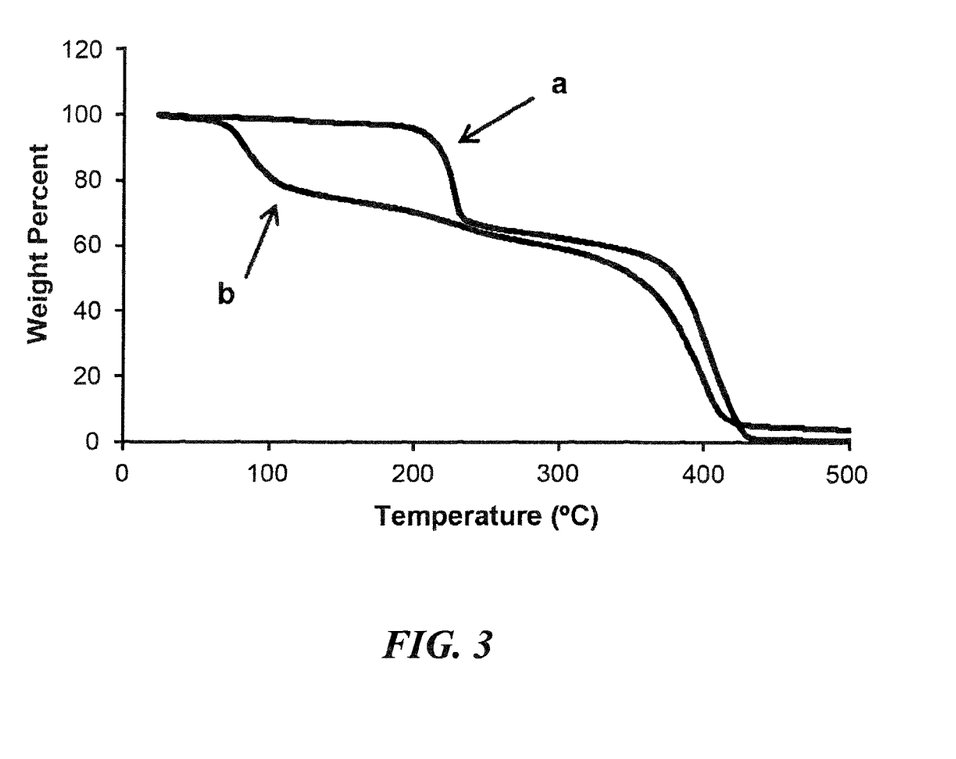
FIG. 3 shows TGA of a) neat poly(TMBA-co-HEMA) and b) poly(HMBA-co-HEMA) with PAG, exposed.

A TBMA:HEMA random copolymer was synthesized for use in a chemically amplified, aqueous developable, cross-linkable system. The polymethacrylate backbone was chosen as a model backbone for exploring the CA patterning and cross-linking reactions. The same patterning and cross-linking reactions described herein may be transposed onto polymer backbones which qualify as permanent dielectrics. The polymer composition was found to be 68.7:31.3 TBMA: HEMA via $^1$H-NMR peak integration. This composition was found to be insoluble in 0.26 N TMAH. The polymer was characterized by GPC to have a $M_n$ of 54,400 g/mol, of 151,100 g/mol, and a polydispersity of 2.78. This polydispersity is characteristic of free radical polymerization reactions (Odian (2004) *Principles of Polymerization*, John Wiley & Sons, Hoboken, N.J.). The $T_g$ of the poly(TBMA-co-HEMA) copolymer was found to be 123° C. as measured by DSC, as shown in FIG. 2. This $T_g$ is adequate for film processing since it is above the post-exposure bake temperature at 100° C. to 110° C. for the acid catalyzed deprotection of TBMA. Reflow of the exposed films could degrade the spatial distribution of the photo-acid and degrade the lithographic critical dimensions. The TGA of the neat polymer revealed two decomposition temperatures. The first decomposition temperature ($T_{d1}$) at 214.2° C. corresponds to the deprotection of the TBMA group. The mass percent decrease at $T_{d1}$ was measured to be 28.1%, which agrees well with the theoretical value of 27.9% for the loss of isobutylene at this polymer composition. A second decomposition temperature ($T_{d2}$) was observed at 378.7° C. due backbone degradation. TGA measurements were also performed on PAG-loaded formulations after spin coating, post apply bake, and blanket exposure. The presence of a photoacid causes a shift in $T_{d1}$ to a lower temperature, 71.8° C., as shown in FIG. 3.

Contamination of the spin-cast film by ambient organic base in the atmosphere can interfere with the CA mechanism of positive-tone resists. Trace amounts of base in the atmosphere can absorb at the solid/air interface and neutralize the acid photoproduct (MacDonald et al. (1991) *Proceedings of SPIE* 1466, 2-12; Kunz et al. (1993) *Proceedings of SPIE* 1925, 167-175). The atmospheric base can have a profound effect due to the catalytic nature of the deprotection reaction. A base-insoluble surface layer was observed on patterned films in the exposed regions due to organic base contamination in the ambient air, even though some carbon filtering of the air was implemented. The surface layer was easily removed by mechanical agitation of the film in the developer. This contamination can be further reduced by additional filtration of the air through activated carbon and limiting the exhaust of volatile bases into the air.

The contrast and sensitivity for two formulations of poly(TBMA-co-HEMA) were evaluated. Formulation A contained 1 pphr Rhodorsil FABA PAG, and Formulation B contained 3 pphr Rhodorsil FABA PAG, as listed in Table 2.

TABLE 2

Contrast Experiment Conditions

| | Formulation | |
|---|---|---|
| | A | B |
| PAG Loading (pphr) | 1 | 3 |
| Thickness (µm) | 9.07 | 9.87 |
| PEB Time (s) | 120 | 120 |
| Developing Time (s) | 120 | 150 |

Figure 4A:
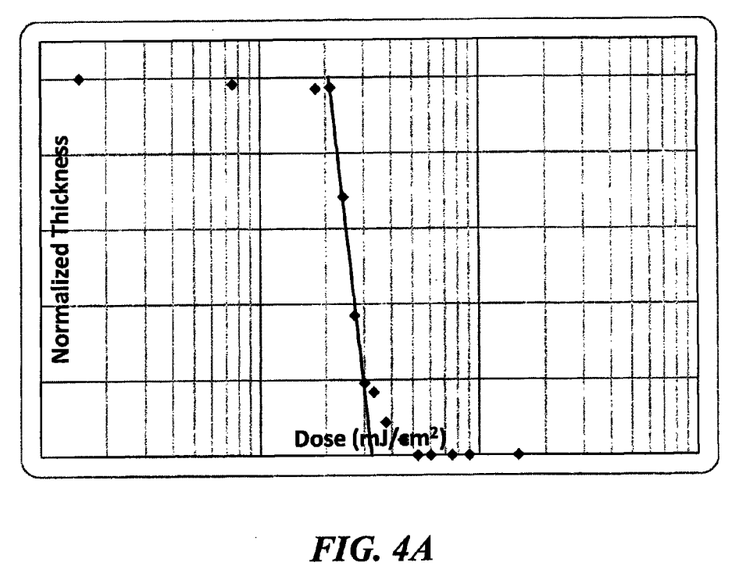
FIG. 4A shows the contrast curves for Formulation A.
Figure 4B:
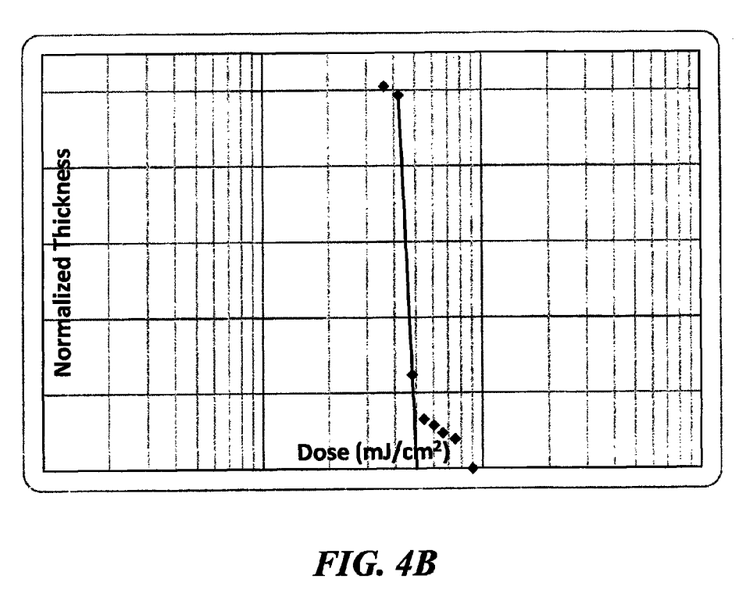
FIG. 4B shows the contrast curves for Formulation B.
Figure 5:
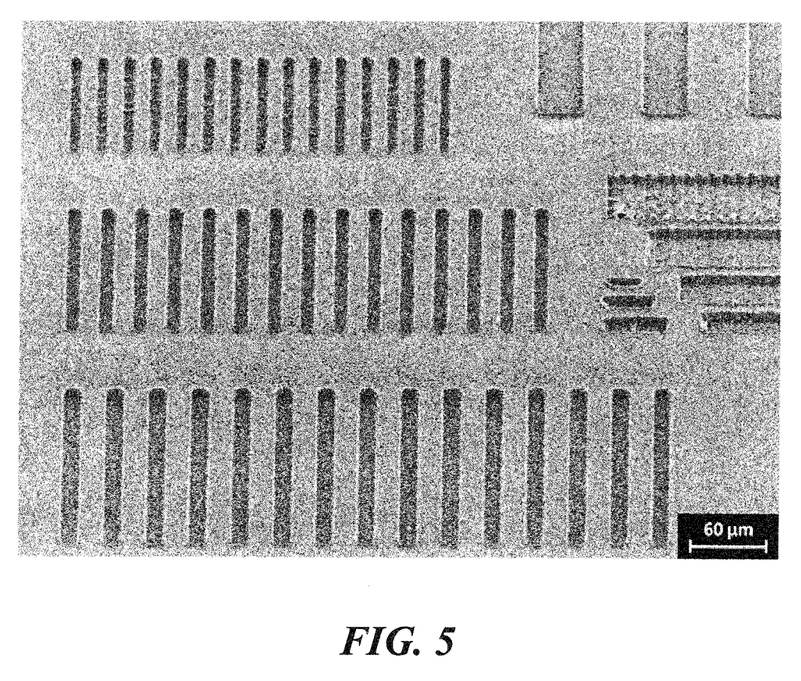
FIG. 5 shows developed trenches of the patterned material made from poly(TBMA-co-HEMA) as the base polymer, containing 1 pphr Rhodorsil FABA PAG (Formulation A).

The contrast curves for Formulations A and B are shown in FIGS. 4A and 4B, respectively. In both cases, an insoluble layer was seen at doses above the conventional $D_{100}$ value, and the thickness of this layer decreased with higher dose. It is hypothesized that this layer is due to organic base adsorbed at the wafer surface. It was also observed that pre-rinsing the wafer in an acid solution can have a significant effect on the thickness of this layer. The processing of this technique has not been optimized. Formulation A was found to have a thick film contrast of 12.7 and a $D_{100}$ of 50.2 mJ/cm². These are good values for positive-tone, thick film formulations. In Formulation B, the increased PAG loading caused the contrast to decrease to 5.1 and the $D_{100}$ to decrease to 31.2 mJ/cm². The decrease in contrast is not desirable and can be attributed to higher acid diffusion into the unexposed regions or to the higher absorption coefficient of the film. The increase in sensitivity, however, is a favorable trait of Formulation B. FIG. 5 shows an SEM image of the patterned trenches in a Formulation A film. In FIG. 5, the half-pitch of the trenches from bottom-to-top are 16, 12.5, and 10 µm. It can be seen that the high contrast of Formulation A produces a vertical sidewall profile.

The lithographic properties for other positive-tone, thick film, permanent dielectrics are presented in Table 3.

TABLE 3

Lithographic Property Comparison of poly (TMBA-co-HEMA) to Reported Positive-tone, Permanent Dielectrics

| Dielectric | Film Thickness (µm) | $D_{100}$ (mJ/cm²) | Contrast |
|---|---|---|---|
| Polyimide | 7.5 | 350 | 1.2 |
| Benzocyclobutene | 16.4 | 810 | 1.02 |
| Formulation A | 9.07 | 50.2 | 12.7 |
| Formulation B | 9.87 | 31.2 | 5.1 |

The CA system presented here has a much smaller $D_{100}$ value than photo-patternable polyimide (Jin & Ishii (2005) *Journal of Applied Polymer Science* 98, 15-21) or benzocyclobutene (So et al. (2001) "Benzocyclobutene-based polymers for microelectronics" *Chemical Innovation* 31, 40-47) dielectrics because of the reuse of the photogenerated acid catalyst. The DQ-based dielectrics are less efficient, because each photon can produce at most one chemical reaction. In addition, the absorption coefficient of DQ makes exposure of thick films difficult because the light intensity decreases exponentially with depth into the film. This also causes the contrast of these dielectrics to degrade with film thickness. The high exposure doses for DQ-based dielectrics results in regions that are partially exposed, containing both DQ and ICA (Mueller et al. (2012) *Journal of Applied Polymer Science* Ahead of Print doi:10.1002/app.38055). These regions have partial solubility in TMAH. Low loadings of the photoactive compound are necessary in the poly(TBMA-co-HEMA) system so that radiation can penetrate the entire depth of the film resulting in a reasonable exposure dose.

The chemical amplification mechanism can be demonstrated by comparing the number of chemical reactions to the number of photons absorbed. Assuming a density of 1.0 g/cm³, a 9.8 µm thick film of Formulation A contains approximately $4.8 \times 10^{-6}$ moles of the TBMA moiety and $9.7 \times 10^{-10}$ moles of PAG per square centimeter. A dose of 50.2 mJ/cm² of 248 nm radiation has a maximum incident dose of $1.04 \times 10^{-7}$ moles of protons per square centimeter. This means that less than 1 photon is required for every 46.3 TBMA moieties at these processing conditions. Although it is not expected that 100% of TBMA groups need to be deprotected for aqueous base solubility, the number of deprotections due to a non-catalytic photoreaction would be insufficient to cause the observed photopatterning. This shows that the solubility-switching reaction must be chemically amplified in nature.

Cross-Linking of Poly(TBMA-co-HEMA).

After developing, the patterned films were given a blanket exposure of 1000 mJ/cm² of 248 nm irradiation to activate the PAG in the undeveloped portions of film. This dose was chosen to ensure that all of the PAG is activated, however, a much smaller dose would suffice. The film was then cured at 120° C. for 10 hours in a nitrogen atmosphere to carry out the Fischer esterification reaction. These conditions were chosen to ensure full cross-linking of the film and continuous removal of water. After curing, the films were insoluble in 0.26 N TMAH, which is a good indication that the carboxylic acid and alcohol functionalities on the base polymer underwent the acid catalyzed Fischer esterification reaction. Films coated at thicknesses greater than ~4 µm would crack during the cure step. This could be due to the large volume change during cross-linking or to a mismatch between the coefficients of thermal expansion for the film and the substrate. Films thinner than 4 μm were crack-free and had good film quality after curing. The mechanical properties and volume change of the film can be tuned by varying the polymer backbone or monomer ratio.

Cross-linking was confirmed by measuring the film stress before and after a thermal cure. A formulation of poly (TBMA-co-HEMA) with 5 pphr PAG was coated to a thickness of 3.94 μm, baked at 100° C. for 60 s, and given an exposure dose of 1000 mJ/cm$^2$ of 248 nm irradiation. A post-exposure bake of 110° C. for 60 s caused the film thickness to decrease to 3.01 μm. The stress of the coated wafer was calculated to be 6.2 MPa. The sample was then cured at 120° C. for 10 hr under ambient atmosphere. The thickness after cure was measured to be 2.77 μm. The final stress was calculated to be 17.9 MPa. The large increase in stress during the cure is a result of film cross-linking. A separate sample was processed under the same conditions as far as the post-exposure bake. After this, the sample was developed in 0.26 N TMAH to verify that these processing conditions did not result in cross-linking prior to curing.

Example 4

Cross-Linking of TBMA:HEMA, Rhodorsil FABA, Trimethylolpropane Ethoxylate and Cross-Linked by Esterification Trimethylolpropane ethoxylate was added at 10 mass parts per hundred parts poly(TBMA-co-HEMA) to act as a cross-linking agent in the Fischer esterification reaction. The sample, which included 3 mass parts Rhodorsil FABA per hundred parts poly(TBMA-co-HEMA), was spin coated from PGMEA to a thickness of 11 μm, and soft baked at 100° C. for 2 minutes. The film was exposed to 248 nm UV radiation through a variable density mask and developed in 0.26 N TMAH for 202 seconds. The contrast and sensitivity (D100) were obtained by plotting the remaining film thickness against the logarithmic exposure dose and linearly fitting the curve near D100. The contrast was found to be 4.8 and the D100 was found to be 202 mJ/cm$^2$. The patterned film was exposed to 1000 mJ/cm$^2$ of 248 nm radiation to activate the PAG and baked at 110° C. for 30 seconds to deprotect the TBMA. The sample was cured at 150° C. for 2 hours. After curing the sample, was insoluble in 0.26 N TMAH, showing that the film had cross-linked during cure.

Although selected embodiments of the present invention have been disclosed for illustrative purposes, those skilled in the art will appreciate that various modifications, additions and substitutions are possible, without departing from the scope and spirit of the invention as disclosed in the accompanying claims.

That which is claimed is:

1. A positive-tone dielectric composition for preparing a positive-tone dielectric film comprising a polymer mixture, wherein the polymer mixture comprises:
   a base polymer comprising a pendent protected organic functionality;
   a photocatalyst for deprotecting the protected organic functionality; and
   a chemical cross-linker for cross-linking the positive-tone dielectric film after photo-patterning has taken place in an aqueous solution.

2. The composition of claim 1, wherein the base polymer is selected from the group consisting of polymethacrylate, polyacrylates, polystyrenes, polyimides, polyamides, polysiloxanes, polysilsesquioxanes, and polynorbornenes.

3. The composition of claim 1, wherein the base polymer is a copolymer comprising two distinctive monomers.

4. The composition of claim 3, wherein the copolymer is a copolymer of two distinctive norbornene monomers.

5. The composition of claim 1, wherein the pendent protected organic functionality is selected from the group consisting of tert-butoxycarbonate (TBOC) and tert-butyl ester (TBE).

6. The composition of claim 1, wherein the photocatalyst for deprotecting the protected organic functionality is a photo-acid generator (PAG).

7. The composition of claim 6, wherein the photo-acid generator is selected from the group consisting of tetrakis-(pentafluorophenyl)borate-4-methylphenyl[4-(1-methylethyl)phenyl]iodonium (Rhodorsil-FABA), tris(4-tert-butylphenyl)sulfonium tetrakis-(pentafluorophenyl) borate (TTBPS-FABA), triphenylsulfonium tetrakis-(pentafluorophenyl) borate (TPS-FABA), bis(4-tert-butylphenyl)iodonium triflate (BTBPI-TF), tert-(butoxycarbonyl-methoxynaphthyl)-diphenylsulfonium triflate (TBOMDS-TF), N-hydroxynaphthalimide triflate (NHN-TF), diphenyliodonium perfluoro-1-butanesulfonate (DPI-NF), tris(4-tert-butylphenyl)sulfonium perfluoro-1-butanesulfonate (TTBPS-NF), N-hydroxynaphthalimide perfluoro-1-butanesulfonate (NHN-NF), N-hydroxy-5-norbornene-2,3-dicarboximide perfluoro-1-butanesulfonate (NHNDC-NF), bis(4-tert-butylphenyl)iodonium tris(perfluoromethanesulfonyl) methide, (BTBPI-TMM), bis(4-tert-butylphenyl)iodonium bis(perfluorobutanesulfonyl) imide (BTBPI-BBI), diphenyliodonium 9,10-dimethoxyanthracene-2-sulfonate (DPI-DMOS), bis(4-tert-butylphenyl) iodonium p-toluenesulfonate (BTBPI-PTS), Ciba IRGACURE® PAG 263 and bis(4-tert-butylphenyl)iodonium perfluoro-1-octanesulfonate (BTBPI-HDF).

8. The composition of claim 1, wherein the photocatalyst for activating the protected organic functionality is activated by ultraviolet radiation.

9. The composition of claim 1, wherein the chemical cross-linker is selected from the group consisting of diazoquinones and free radical cross-linking moieties.

10. The composition of claim 1, wherein the photocatalyst is pendent on the base polymer.

11. The composition of claim 1, wherein the chemical cross-linker is pendent on the base polymer.

12. The composition of claim 11, wherein the chemical cross-linker is selected from the group consisting of carboxylic acids, alcohols, alkenyl groups and cyclic ethers.

13. The composition of claim 1, wherein the chemical cross-linker is a multifunctional alcohol or a multifunctional carboxylic acid.

14. A positive-tone dielectric film comprising a polymer mixture, wherein the polymer mixture comprises:
   a base polymer comprising a pendent protected organic functionality;
   a photocatalyst for deprotecting the protected organic functionality; and
   a chemical cross-linker for cross-linking the positive-tone dielectric film after photo-patterning has taken place in an aqueous solution.

15. The dielectric film of claim 14, wherein the base polymer is selected from the group consisting of polymethacrylate, polyacrylates, polystyrenes, polyimides, polyamides, polysiloxanes, polysilsesquioxanes, and polynorbornenes.

16. The dielectric film of claim 14, wherein the base polymer is a copolymer comprising two distinctive monomers.

17. The dielectric film of claim 16, wherein the copolymer is a copolymer of two distinctive norbornene monomers.

18. The dielectric film of claim 14, wherein the pendent protected organic functionality is selected from the group consisting of tert-butoxycarbonate (TBOC) and tert-butyl ester (TBE).

19. The dielectric film of claim 14, wherein the photo-catalyst is a photo-acid generator (PAG).

20. The dielectric film of claim 14, wherein the photo-catalyst is pendent on the base polymer.

21. The dielectric film of claim 19, wherein the photo-acid generator is selected from the group consisting of tetrakis-(pentafluorophenyl)borate-4-methylphenyl[4-(1-methyl-ethyl)phenyl]iodonium (Rhodorsil-FABA), tris(4-tert-butyl-phenyl)sulfonium tetrakis-(pentafluorophenyl) borate (TTBPS-FABA), triphenylsulfonium tetrakis-(pentafluorophenyl) borate (TPS-FABA), bis(4-tert-butylphenyl)iodonium triflate (BTBPI-TF), tert-(butoxycarbonyl-methoxynaphthyl)-diphenylsulfonium triflate (TBOMDS-TF), N-hydroxynaphthalimide triflate (NHN-TF), diphenyliodonium perfluoro-1-butanesulfonate (DPI-NF), tris(4-tert-butylphenyl)sulfonium perfluoro-1-butanesulfonate (TTBPS-NF), N-hydroxynaphthalimide perfluoro-1-butanesulfonate (NHN-NF), N-hydroxy-5-norbornene-2,3-dicarboximide perfluoro-1-butanesulfonate (NHNDC-NF), bis(4-tert-butylphenyl)iodonium tris(perfluoromethanesulfonyl) methide, (BTBPI-TMM), bis(4-tert-butylphenyl)iodonium bis(perfluorobutanesulfonyl) imide (BTBPI-BBI), diphenyliodonium 9,10-dimethoxyanthracene-2-sulfonate (DPI-DMOS), bis(4-tert-butylphenyl) iodonium p-toluenesulfonate (BTBPI-PTS), Ciba IRGACURE® PAG 263 and bis(4-tert-butylphenyl)iodonium perfluoro-1-octanesulfonate (BTBPI-HDF).

22. The dielectric film of claim 14, wherein the photocatalyst for deprotecting the protected organic functionality is activated by ultraviolet radiation.

23. The dielectric film of claim 14, wherein the cross-linker is selected from the group consisting of diazoquinones and free radical cross-linking moieties.

24. The dielectric film of claim 14, wherein the chemical cross-linker is pendent on the base polymer.

25. The dielectric film of claim 24, wherein the pendent on the base polymer chemical cross-linker is selected from the group consisting of carboxylic acids, alcohols, alkenyl groups and cyclic ethers.

26. The dielectric film of claim 14, wherein the chemical cross-linker comprises a small molecule cross-linker.

27. The dielectric film of claim 26, wherein the small molecule cross-linker is a multifunctional alcohol or a multifunctional carboxylic acid.

28. A method of preparing a positive-tone dielectric film comprising the steps of:
providing a base polymer comprising a pendent protected organic functionality and a photocatalyst for deprotecting the pendent protected organic functionality;
patterning the base polymer with a mask;
deprotecting the pendent protected organic functionality;
developing a positive-tone image in an aqueous base to provide a photo-pattern on the dielectric film; and
curing the dielectric film with a chemical cross-linker after photo-patterning.

29. The method of claim 28, wherein the base polymer is selected from the group consisting of polymethacrylate, polyacrylates, polystyrenes, polyimides, polyamides, polysiloxanes polysilsesquioxanes and polynorbornenes.

30. The method of claim 28, wherein the base polymer is a copolymer comprising two distinctive monomers.

31. The method of claim 30, wherein the copolymer is a copolymer of two distinctive norbornene monomers.

32. The method of claim 28, wherein the pendent protected organic functionality is selected from the group consisting of tert-butoxycarbonate (TBOC) and tert-butyl ester (TBE).

33. The method of claim 28, wherein the photocatalyst is a photo-acid generator (PAG).

34. The method of claim 33, wherein the photo-acid generator is selected from the group consisting of tetrakis-(pentafluorophenyl)borate-4-methylphenyl[4-(1-methyl-ethyl)phenyl]iodonium (Rhodorsil-FABA), tris(4-tert-butyl-phenyl)sulfonium tetrakis-(pentafluorophenyl) borate (TTBPS-FABA), triphenylsulfonium tetrakis-(pentafluorophenyl) borate (TPS-FABA), bis(4-tert-butylphenyl)iodonium triflate (BTBPI-TF), tert-(butoxycarbonyl-methoxynaphthyl)-diphenylsulfonium triflate (TBOMDS-TF), N-hydroxynaphthalimide triflate (NHN-TF), diphenyliodonium perfluoro-1-butanesulfonate (DPI-NF), tris(4-tert-butylphenyl)sulfonium perfluoro-1-butanesulfonate (TTBPS-NF), N-hydroxynaphthalimide perfluoro-1-butanesulfonate (NHN-NF), N-hydroxy-5-norbornene-2,3-dicarboximide perfluoro-1-butanesulfonate (NHNDC-NF), bis(4-tert-butylphenyl)iodonium tris(perfluoromethanesulfonyl) methide, (BTBPI-TMM), bis(4-tert-butylphenyl)iodonium bis(perfluorobutanesulfonyl) imide (BTBPI-BBI), diphenyliodonium 9,10-dimethoxyanthracene-2-sulfonate (DPI-DMOS), bis(4-tert-butylphenyl) iodonium p-toluenesulfonate (BTBPI-PTS), Ciba IRGACURE® PAG 263 and bis(4-tert-butylphenyl)iodonium perfluoro-1-octanesulfonate (BTBPI-HDF).

35. The method of claim 28, wherein the photocatalyst for deprotecting the protected organic functionality is activated by ultraviolet radiation.

36. The method of claim 28, wherein the chemical cross-linker is selected from the group consisting of diazoquinones and free radical cross-linking moieties.

37. The method of claim 28, wherein the chemical cross-linker is pendent on the base polymer.

38. The method of claim 28, wherein the photocatalyst is pendent on the base polymer.

39. The method of claim 37, wherein the chemical cross-linker is selected from the group consisting of carboxylic acids, alcohols, alkenyl groups and cyclic ethers.

40. The method of claim 28, wherein the chemical cross-linker is a multifunctional alcohol or a multifunctional carboxylic acid.

41. A dielectric film prepared by the method of claim 28.

* * * * *

UNITED STATES PATENT AND TRADEMARK OFFICE
CERTIFICATE OF CORRECTION

PATENT NO. : 9,740,096 B2  
APPLICATION NO. : 14/411767  
DATED : August 22, 2017  
INVENTOR(S) : Mueller et al.

Page 1 of 1

It is certified that error appears in the above-identified patent and that said Letters Patent is hereby corrected as shown below:

In the Specification

Column 14, Line 55:
Please correct "g/mol, of" to read -- g/mol, $M_w$ of --

Signed and Sealed this  
Twenty-sixth Day of June, 2018

Andrei Iancu  
*Director of the United States Patent and Trademark Office*